United States Patent
Rohleder et al.

(10) Patent No.: US 10,825,486 B2
(45) Date of Patent: Nov. 3, 2020

(54) HIGH PERFORMANCE METHOD FOR REDUCTION OF MEMORY POWER CONSUMPTION EMPLOYING RAM RETENTION MODE CONTROL WITH LOW LATENCY AND MAXIMUM GRANULARITY

(71) Applicant: NXP USA, Inc., Austin, TX (US)

(72) Inventors: Michael Rohleder, Unterschleissheim (DE); David A. Brown, Austin, TX (US); Peter M. Ippolito, Austin, TX (US); Ilhan Hatirnaz, Munich (DE)

(73) Assignee: NXP USA, Inc., Austin, TX (US)

( * ) Notice: Subject to any disclaimer, the term of this patent is extended or adjusted under 35 U.S.C. 154(b) by 289 days.

(21) Appl. No.: 15/948,251

(22) Filed: Apr. 9, 2018

(65) Prior Publication Data

US 2019/0311748 A1  Oct. 10, 2019

(51) Int. Cl.
*G11C 5/14* (2006.01)
*G11C 8/12* (2006.01)
*G06F 13/42* (2006.01)

(52) U.S. Cl.
CPC ............... *G11C 5/147* (2013.01); *G11C 8/12* (2013.01); *G06F 13/42* (2013.01)

(58) Field of Classification Search
CPC ............ G11C 5/147; G11C 8/12; G06F 13/42
See application file for complete search history.

(56) References Cited

U.S. PATENT DOCUMENTS

| | | | |
|---|---|---|---|
| 5,475,847 A | 12/1995 | Ikeda | |
| 5,887,179 A | 3/1999 | Halahmi et al. | |
| 6,442,701 B1 | 8/2002 | Hurd | |
| 6,917,555 B2 | 7/2005 | Bedwell et al. | |
| 2007/0047342 A1* | 3/2007 | Nagai | G11C 8/12 365/200 |
| 2008/0082753 A1 | 4/2008 | Licht et al. | |
| 2014/0082322 A1* | 3/2014 | Loh | G06F 12/00 711/202 |

(Continued)

OTHER PUBLICATIONS

NXP Freescale Semiconductor, Freescale Technologies for Energy Efficiency, White Paper, Document No. ENERGYEFFWP / Rev. 5, 2009-2010.

(Continued)

*Primary Examiner* — Jaweed A Abbaszadeh
*Assistant Examiner* — Gayathri Sampath

(57) ABSTRACT

A power control system, method, and architecture are disclosed for a multi-bank memory which provides independent, concurrent memory access to at least one memory block in each memory bank by using observation circuits to monitor bus masters connected over bus master interface signals to an interconnect for memory access requests to the multi-bank memory and to provide notifications to a power control circuitry that a valid memory access request was issued by a bus master over the bus master interface, where the power control circuitry processes the notifications received from each observation circuit and generates therefrom power control signals that are provided directly to each memory block and to bypass the interconnect, thereby separately controlling a power state for each memory block with power-up control signals that arrive at each memory block at or before a memory access request sent over the interconnect.

18 Claims, 4 Drawing Sheets

(56) References Cited

U.S. PATENT DOCUMENTS

| 2014/0115358 | A1* | 4/2014 | Priel | G11C 7/22 |
| | | | | 713/320 |
| 2015/0106671 | A1 | 4/2015 | Guo et al. | |
| 2017/0039104 | A1 | 2/2017 | Kapoor et al. | |
| 2017/0269861 | A1* | 9/2017 | Lu | G06F 3/0647 |
| 2018/0067539 | A1* | 3/2018 | Samson | G11C 5/14 |

OTHER PUBLICATIONS

Lahcen Hamouche et al., Low Power Options for 32 nm Always-on SRAM Architecture, Elsevier, ScienceDirect, Solid-State Electronics, vol. 58, Issue 1, Apr. 2011, pp. 83-95.

Bruno Bailly et al., Succeeding in Implementing a Low-Power SoC with Power Islands, Dolphin Integration, SNUG, Jun. 18, 2015.

Dan Nicolaescu et al., Reducing Power Consumption for High-Associativity Data Caches in Embedded Processors, IEEE, Design, Automation and Test in Europe Conference and Exhibition, Mar. 7, 2003.

\* cited by examiner

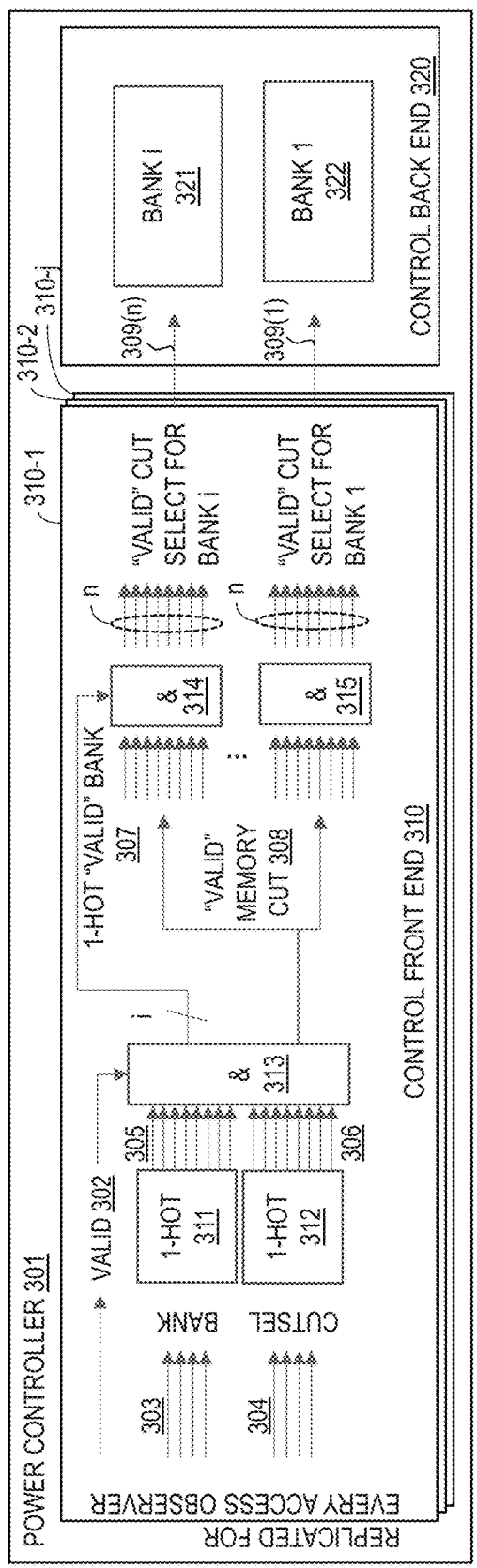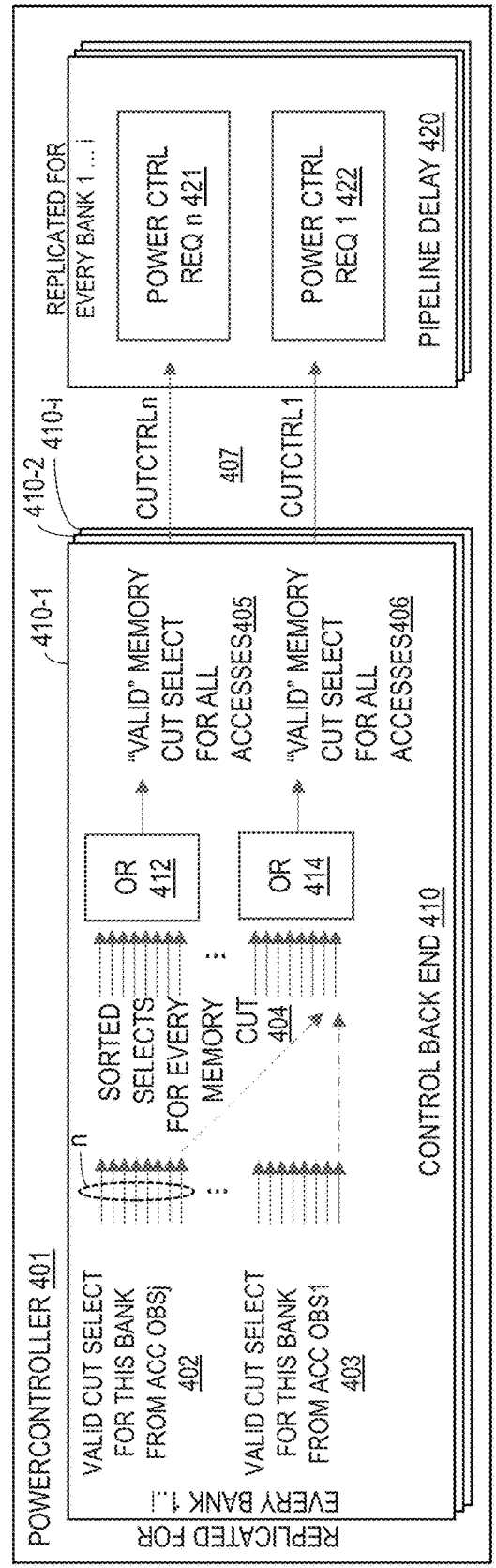

HIGH PERFORMANCE METHOD FOR REDUCTION OF MEMORY POWER CONSUMPTION EMPLOYING RAM RETENTION MODE CONTROL WITH LOW LATENCY AND MAXIMUM GRANULARITY

BACKGROUND OF THE INVENTION

Field of the Invention

The present invention is directed in general to the field of integrated circuits and methods of operating same. In one aspect, the present invention relates to a method, apparatus and system for power management for reducing leakage current in integrated circuits.

Description of the Related Art

Electronic devices, such as cell phones, personal digital assistants, handheld computing devices, and similar automotive, wireless and/or mobile electronic devices, that incorporate integrated circuits, especially integrated circuit memories, are very sensitive to power consumption. But as system memories increase in size, there are increasing tradeoffs between various design and performance requirements, such as, for example, memory access or throughput rates, power consumption, and circuit complexity. For example, increased system memory throughput is achieved by organizing the system memory in memory banks to enable concurrent accesses by multiple master devices e.g., processor cores or DMA controllers), where each bank includes one or more memory blocks or "cuts" which extend across the width of the bank, depending on the amount of memory and memory cut size. Such systems typically use an on-chip network, such as a switch fabric interconnect or another form of crossbar, to eliminate internal bottlenecks, thereby imposing a complexity and performance penalty for pathway delays over the interconnect. To increase the memory bandwidth for reading and writing to multi-bank memory systems, the memory banks may use memory interleaving to accomplish more efficient distribution of memory accesses by statistically distributing the accesses by any bus master over multiple, independently working banks. As will be appreciated, schemes which attempt to solve the memory space problems can result in large amounts of enabled memory that are not being accessed during a read or write window, resulting in significant power dissipation for no functional purpose. Various solutions for addressing power dissipation include using a standby mode, where memory is active and can be accessed, or a retention mode, where memory content is retained but cannot be accessed immediately. For example, a low power retention mode may power down the periphery logic but retain the memory content by supplying an intermediate power level to the memory system which is less than the power required for a memory that is in active mode, but more than the power required for a memory that is powered down. However, conventional retention mode operation can still needlessly dissipate power whenever more memory elements are kept in standby than are actually being accessed, such as when all memories within an accessed bank or all memories of a stripe across multiple banks are active, although only a small subset of these memory elements is accessed. In addition, existing retention mode operations typically impose a power-up latency cost on memory system accesses to allow the memory to charge up and hence to become capable of responding to new access requests. This latency can have a negative impact on the overall system performance, including imposing additional delays and, even worse, negatively impacting the power consumption. These cases arise when a series of memory system accesses is made, causing the memory system to "toggle" between entering and leaving the retention mode in a short period of time, with the effects of the related power mode changes (entering retention mode, leaving retention mode, etc.) resulting in unwanted additional power consumption that negates the desired power savings. As seen from the foregoing, there are challenges with using existing memory design and power management solutions to quickly and efficiently access system memory without wasting power or imposing power-up latency costs.

BRIEF DESCRIPTION OF THE DRAWINGS

The present invention may be understood, and its numerous objects, features and advantages obtained, when the following detailed description of a preferred embodiment is considered in conjunction with the following drawings.

FIG. 3 is a simplified block diagram depiction of a memory power controller to show a controller front end and back end in accordance with selected embodiments of the present disclosure.

FIG. 4 is a simplified block diagram depiction of a memory power controller to show a controller back end and pipeline delay circuit in accordance with selected embodiments of the present disclosure.

DETAILED DESCRIPTION

Figure 1:
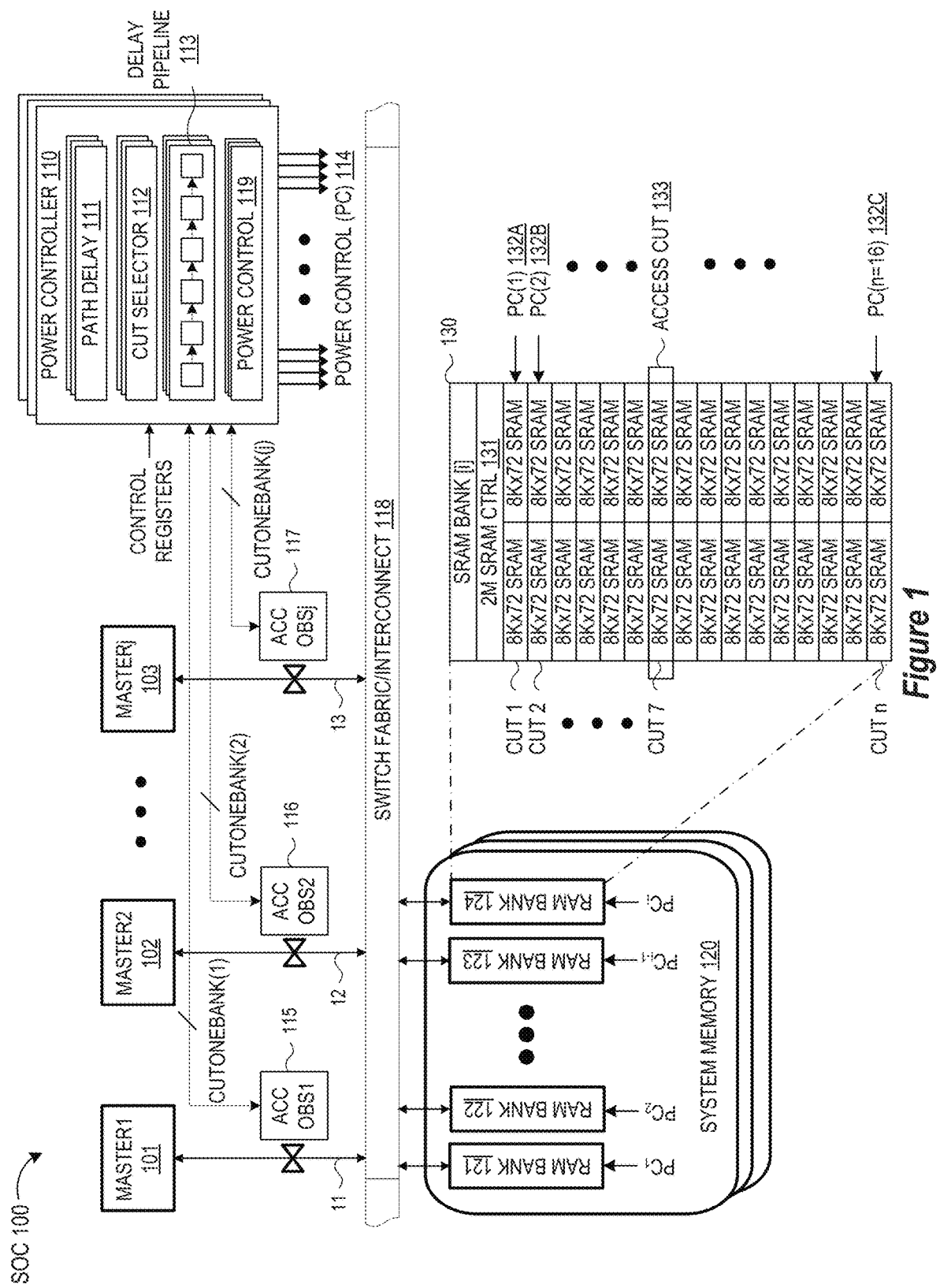
FIG. 1 is a simplified block diagram of selected portions of an integrated circuit system-on-chip (SoC) with power management for reducing power consumption in a multi-bank memory system in accordance with selected embodiments of the present disclosure.

A high-performance memory control system, apparatus, architecture, and methodology are described for reducing memory power consumption and optimizing memory access performance by selectively employing a low power memory mode with maximum granularity and low latency transition from a reduced power state to an active state. In selected example embodiments, the disclosed memory architecture, system, and methodology compensate for power mode transition latencies in a multi-bank interleaved memory system by observing memory access requests and generating corresponding memory power control signals to optimize memory access performance. The memory access request observation is capable of identifying the selected memory block(s) or cut(s) before they enter the on-chip network to generate corresponding memory power control signals which are supplied to enable the addressed memory bank block(s)/cuts(s) to enter or exit a low power state (e.g., retention mode). As such, the disclosed embodiments exploit knowledge about the memory architecture, in particular the organization of the memory into memory banks and memory blocks/cuts within each bank, and the intrinsic delay required for distributing and managing such accesses within a SoC to determine the low power state for every addressed memory block significantly earlier or even before the actual memory access request reaches the addressed memory block over the on-chip network. When embodied with a multi-bank random access memory where memory blocks in each bank may be concurrently accessed over an interconnect by one or more bus masters (e.g., multi-core devices) and where each bank or blocks within each bank may be separately placed in a low power state, the disclosed memory architecture, system, and methodology may use an access observer unit (or bus monitor) attached to each bus master in combination with one or more power control units that control a particular power state of the memory blocks within each bank. Depending on the memory architecture and the amount and type of power control unit being used, there may be a central power control unit, or the elements of such a power control unit may be distributed to manage a specific portion of the accesses, such as, for example a) combining the observation results for all masters, b) managing power control information for a single bank, and/or c) managing power control information for one of the multiple access blocks within a bank. In operation, each access observer unit is positioned to observe or detect memory block accesses performed by a corresponding bus master as they enter the interconnect bus, and to convey detected access information to the power control unit(s). In turn, the power control unit(s) generate memory power control signals to control the power state of the accessed memory block in accordance with detected access information that is provided by the access observer unit(s). In addition, the power control unit(s) exploit the inherent delays related to the interconnect bus delay, alone or in combination with RAM access/bank access delays, to avoid needless switching between power states for every managed memory element while also maximizing the granularity of memory power control being chosen (i.e., memory bank, memory block/cut). In this way, the memory control system supports concurrent memory bank accesses by multiple bus masters (e.g., multi-core devices) to an interleaved multi-bank memory with very high granularity while reducing memory power consumption by generating memory power control signals which exploit the inherent delays for memory block accesses over the on-chip network to selectively remove a managed memory block element from a lower power state. For this purpose, it may factor in knowledge about the intrinsic delay of the interconnect and the RAM access/bank access delays, thus enabling a transition from a reduced power state to an active power state before the memory access requests reach the memory so that memory access delays associated with power-up operations are reduced or eliminated. In addition, the combination of these delays is used to create an "observation window" during which needless changes in the power-state can be inhibited. As a result, the multi-bank memory system will operate with reduced system power in the low power mode and will also be able to process a memory access request instantly or at least more quickly than compared to having the accessed memory block leave the low power mode when the memory access request reaches the memory bank controller.

To provide additional details for an improved understanding of selected embodiments of the present disclosure, reference is now made to FIG. 1 which is a simplified block of an integrated circuit system-on-chip (SoC) 100 which includes one or more bus masters 101-103 connected across the switch fabric interconnect 118 for performing memory access operations e.g., reading or writing) to the multi-bank system memory 120. To provide power management for reducing power consumption by the multi-bank memory system 120, the SOC 100 also includes access observers 115-117 connected to one or more memory power controller 110, with the access observers 115-117 positioned right at the outputs of the bus masters 101-103 to detect valid memory accesses by the bus masters before these enter the interconnect. Thus positioned, the access observers 115-117 can provide memory access information to the memory power controller 110 functionality to generate specific power control signals to reduce power consumption for specified memory cuts in the multi-bank memory 120. As will be appreciated, the memory power controller 110 may be implemented as a centralized functionality or as a distributed functionality across access observers and banks/memory cuts as described hereinbelow with reference to FIGS. 3-4. In addition, the memory power controller functionality may be implemented with hardware that is controlled by software which sets up and/or configures the function beforehand so that, when a memory access request is seen, the function executes with no additional software control needed.

As will be appreciated, each bus master (e.g., 101) may be a processor core, direct memory access (DMA) controller, or other computing device which can initiate memory access transactions on the switch fabric interconnect 118 over a corresponding switching interface (e.g., 11). For example, a first bus master (Master 1) may be a processor core which executes instructions using instruction data and operand data that are accessed in system memory 120, with data resulting from the execution of the instructions also being provided for storage in the system memory 120. By allowing multiple bus master devices 101-103 to use corresponding switching interfaces 11-13 to access the switch fabric interconnect 118 concurrently, performance for general-purpose systems can be significantly improved. To this end, each switching interface 11-13 can be implemented with one or more suitable communication buses, such as an Advanced eXtensible Interface (AXI), an Advanced High-performance bus (AHB), or other suitable bus(es), or a combination thereof. As used herein, the term "bus" may refer to a plurality of signals or conductors which may be used to transfer one or more various types of information, such as data, addresses, control, or status. While the bus conductors may be illustrated or described as a single conductor, a plurality of conductors, unidirectional conductors, or bidirectional conductors, it will be appreciated that different embodiments may vary the implementation of the bus conductors. For example, separate unidirectional conductors may be used rather than bidirectional conductors and vice versa. Also, a plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Memory access requests from one or more bus masters 101-103 that are sent over the interconnect 118 are received at system memory 120 which may be constructed with RAM blocks (also referred to as memory cuts) organized as a plurality of i independently-accessible memory banks 121-124 which are each formed by n memory blocks (e.g., n≥1). As disclosed herein, each memory block or "cut" is a sub-array of one or more macrocells which spans across the width of the bank, with FIG. 1 illustrating that the ith SRAM bank 130 includes "n" memory blocks (or "cuts" or "subarrays"), each of which is formed with two 8K×72 SRAM macrocells which span across the width of the bank 130. However, it will be understood that an accessed memory block may be formed with one or more macrocells which together extend across the width of the bank. As a result of this multi-bank memory configuration, a plurality of bus masters 101-103 can snake independent, concurrent memory access operations into the memory blocks in the plurality of i banks 121-124. In this arrangement, the system memory 120 is structured as an n>i array of memory blocks, with each RAM bank 121-124 corresponding to a column of the shown memory array, and each memory block in a bank corresponding to a row in the detail shown for a single bank of the memory array. Using an interleaved memory scheme for accessing the system memory 120, every memory bank 121-124 can handle a maximum of a single memory access every clock cycle. As will be appreciated, multiple accesses may be in flight (in various stages) in parallel with a pipelined memory architecture where a new access can be issued at every cycle to a memory bank.

As the size of the multi-bank system memory 120 increases, larger amounts of memory blocks are needed to provide the amount of storage required by a single bank when performing memory access operations in the memory banks 121-124, thereby consuming more and more power, even when not all of the memory blocks in a bank are being accessed. For example, a 32 MByte SRAM system memory consisting of i=16 memory banks, each having 16 memory blocks, will have 256 memory blocks that consume a large amount of active power (e.g., 256×2.57 mW/cut=658 mW), though it will be appreciated that these numbers will be different for different memory design and process technologies. In contrast to this memory access scenario, a single access can be issued in every cycle to every memory bank, accessing a single address within this bank. As a result, all memory blocks not accessed by a single access could be put into a lower power mode for this access. In the example embodiment of FIG. 1, employing 16 banks which each have 16 memory blocks, only the single accessed memory block or cut within a bank must be in the active power mode. In this example, the remaining 15 memory blocks of an accessed memory bank could be put in a low power mode. In case a bank is not accessed at all, all memory blocks of this bank could be put into the low power mode. Both examples assume that this would not result in excessive power consumption on toggling in and out of power states.

If the total amount of system memory is not required for all applications, the power consumption can be further reduced by completely powering down the unused memory blocks, thereby reducing power consumption (e.g., active power of 2.57 mW/cut versus disabled power of 0.22 mW/cut). Another intermediate power saving capability is provided by placing the system memory 120 in a reduced power mode in which the system memory 120 does not operate (e.g., is not readable or writeable), but retains its stored data. The low power mode may be associated with a sleep mode, into which the memory block can enter, for example, after a pre-determined period of inactivity. In the low power mode, the memory power controller 110 may be configured to provide one or more low power supply voltages to each memory block of the system memory 120, where each retention supply voltage is less than the operational supply voltage. The low power supply voltages applied to the system memory 120 in the low-power mode are controlled by the memory power controller 110 by power control signals 114 which are connected directly to the n memory blocks in each memory bank, thereby bypassing the path delays inherent with the memory request signal propagation through the interconnect 118. Since not all memory blocks are accessed in any given cycle, the low power mode operation can achieve significant power savings (e.g., 25-35% for a single memory block) as compared to fully enabled or active memory operation, but there are performance costs imposed by the extra wakeup time (or "power up latency") required for moving a system memory bank from low power mode to active mode (e.g., approximately 10 cycles for memories in an example implementation) and the power transition itself may also consume or require some extra power.

To address these and other limitations from conventional memory power control operations, observer units or bus monitors 115-117 are connected in close proximity to each bus master 101-103 to observe at the earliest point possible any memory access by the corresponding bus master and to determine the accessed memory block being accessed by the corresponding bus master. While any suitable circuit configuration for observing memory access operations may be used, selected embodiments of the bus monitor (e.g., 115) may include interfaces, a bus watching circuit, and storage elements which are connected and configured as an access observer block. The transaction monitor interface provides a connection between the bus master interface signal(s) and the bus monitor. The configuration interface provides access for software to program trigger conditions to the bus watching circuit. The access interface allows a captured trace of bus states to be uploaded to the memory power controller 110 (described hereinbelow). The bus watching circuit monitors the transactions on the bus master interface signals to produce an output on the access interface when a triggering event matches the programmed trigger condition, such as detecting a valid memory access along with the corresponding memory address in the system memory 120. The storage elements store valid memory access and address data from the bus master interface signals in response to the bus watching circuit trigger output, which are then forwarded to the memory power controller 110 over the access interface.

At a memory power controller 110, the observed memory access data collected by the bus monitors 115-117 may be processed to generate power control signals 114 which are provided directly to the memory banks 121-124. In selected embodiments, the memory power controller 110 is embodied as a centrally-located memory power controller, but may alternatively be embodied in distributed form to provide a plurality of memory power controllers in distributed locations at each bus master and/or each memory bank 121-124. While a single, centralized memory power controller 110 may provide a lower cost solution, the provision of distributed memory power controllers 110 at each memory bank provides a layout-aware implementation which may reduce extra delays from distributing the power control signals to different memory bank locations. Wherever located, the memory power controller(s) 110 is controlled by one or more control register inputs to assemble memory access information (e.g., CUTONEBANK(i) in FIG. 1) from the bus monitors 115-117 for each memory access block in each memory bank. Based on the known or predetermined path delays 111 for each memory access over the interconnect 118, the memory power controller(s) 110 uses the assembled memory access information to generate power control signals 114 that are provided as power state update requests to each memory bank and accessed memory block (e.g., access cut) in the system memory 120 so as to arrive before the memory access request arrives over the interconnect 118.

Figure 2:
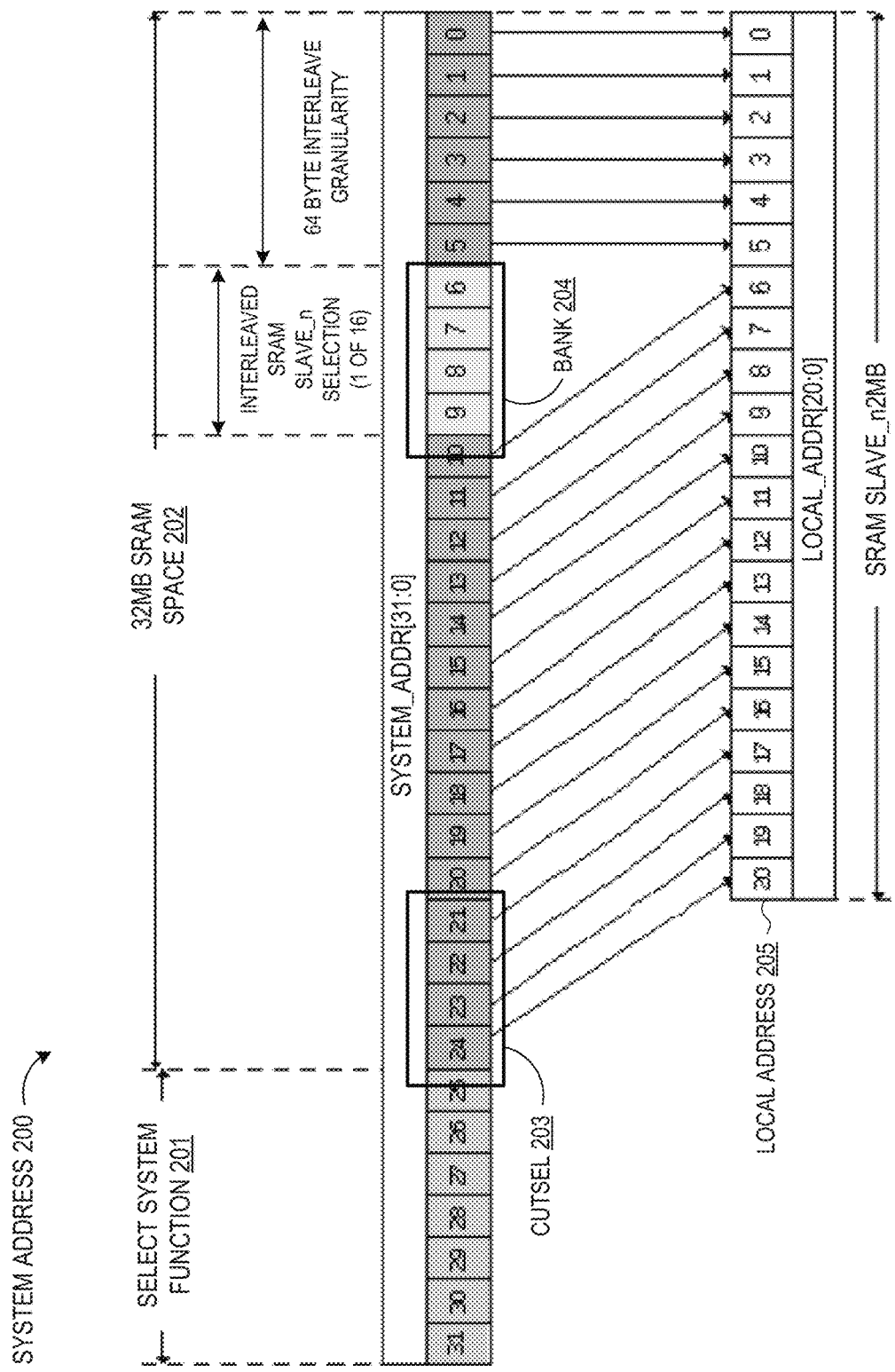
FIG. 2 is a simplified depiction of an on-chip interleaved memory addressing scheme in accordance with selected embodiments of the present disclosure.

As disclosed herein, the power control signals 114 can be generated from the detected memory access requests in different ways. One approach is for each bus monitor 115-117 to capture relevant address bits from valid memory accesses which identify the accessed memory bank and block in a multi-bank system memory 120. To provide additional details for an improved understanding of selected embodiments of the present disclosure for monitoring memory accesses, reference is now made to FIG. 2 which is a simplified depiction of an on-chip interleaved memory addressing scheme in which a system address 200 has a first plurality of address bits (e.g., [31:0]) divided into a system selection field 201 (e.g., [31:25]) and a system memory address space field 202 (e.g., [24:0]). As will be appreciated, the System RAM is addressed only when the bits of the system function selection field 201 select a certain address range, and another address may select other parts of the system (e.g., peripheral elements, a ROM or a Flash memory). With the disclosed addressing scheme, predetermined address bits (e.g., [9:6]) from the system memory address space field 202 may be used to select one of the i independently accessible memory banks 121-124 as a bank selection address 204. For example, four address bits may specify one of 16 memory banks being accessed. To further specify the memory block accesses within one bank, one or more predetermined address bits (e.g., [24:21]) from the system memory address space field 202 may be used to select one of the n memory blocks or cuts within the selected memory bank as a cut selection (CUTSEL) address 203. For example, four further address bits may specify one of 16 memory blocks or cuts being accessed in a selected memory bank. Once the interleaved memory bank is selected, the local address 205 for the memory access block/cut may be specified by removing the bank selection address 204, thereby generating a local address having a second plurality of address bits (e.g., [20:0]) which includes the bits from the cut selection address 203. As will be appreciated, such selection of significant address bits may be a function of the memory architecture and constant for a particular SoC implementation, though in other embodiments, the address bit selection may be programmably determined.

To provide additional details for an improved understanding of selected embodiments of the memory power controller 110, reference is now made to FIG. 3 which is a simplified block diagram depiction of a memory power controller 301 which is used to generate power control signals PC(i) by processing the memory accesses observed by the j access observers 115-117 using a controller front end 310 and controller back end 320 which are configured to identify the memory access specific part of this processing. As illustrated, the memory power controller 301 includes a plurality of j controller front end blocks 310-1, 310-2, ... 310-j and a single controller back end block 320, where each controller front end block 310 is connected to a corresponding memory access observer. Thus, the logic in the controller front end block 310 will be replicated for every access observer which is positioned and configured to determine specified access related information 302-304 from its master device, including a "VALID" access request 302 and the relevant memory address portion(s) 303-304. For example, the "VALID" access signal 302 from a memory access observer identifies a valid access or indicates there is no such access (e.g., no access at all, or access that does not refer to RAM). In addition, the memory access observer will provide the significant portion of the corresponding memory address, such as by extracting the bank selection address (BANK) 303 and the cut selection address (CUTSEL) 304. At each controller front end block 310, the memory address portions, 303, 304 may be decoded by corresponding 1-hot encoder elements 311, 312 to provide a set of singular signals that identify the selected bank and the selected memory cut, respectively. As will be appreciated, each 1-hot encoder 311, 312 may be connected to receive a binary encoded signal (e.g., a 2-bit signal to select 1 out of 4 selections 00, 01, 10, 11) from its corresponding memory access observer, and to generate therefrom an encoded set of output lines 305, 306 where only a single one of these lines is active at a time (e.g., 0001, 0010, 0100, 1000).

At a first stage AND (&) gate 313, any of the singular signals 305, 306 may be combined with the "VALID" access qualifier signal 302 to ensure that only valid accesses to a RAM element are processed. The resulting AND gate 313 output signals are further referred as VALID bank select signal 307 and VALID memory cut select signals 308. In particular, the output of the 1-hot encoders 311, 312 provides an exact selection of the memory cut within the set of banks. These signals are now referred to as VALID (bank/memory cut) select signals. By logically combining these signals 305, 306 at the AND gate 313, there will be a single, 1-hot encoded selection signal in case of a valid access or no such signal (all 0's).

The resulting (1-hot encoded) VALID bank select signal 307 and VALID memory cut select signal 308 are then further combined by a second logical combination stage consisting of i sets of n 2-input AND gates 314, 315. Any of the i sets of second stage AND gates 314, 315 receives all n VALID memory cut select signals 308 and combines them with one of the i VALID bank selects 307 (e.g., set i uses the one for BANK i) to generate corresponding "VALID" memory cut select signals 309(1)-(n) for each bank. Thus, the second stage AND gates 314, 315 output 1-hot encoded memory cut select signals 309 for all banks to the controller back end 320, where only a single signal (the one for the selected memory cut within the selected bank) is being asserted. Through the control back end 320, these signals can then be distributed to memory bank specific processing as described in FIG. 4. To provide additional details for an improved understanding of selected embodiments of the memory power controller 401, reference is now made to FIG. 4 which is a simplified block diagram depiction of a controller back end 410 which is used to generate power control signals PC(i) by processing the "VALID" memory cut select signals 402-403 for every bank, as these are provided by the multiple (j) controller front end(s) 310 described in FIG. 3 as memory cut select signal 309 (1 . . . n) for every bank. For this purpose, it employs a controller back end 410 and pipeline delay block 420 for every bank which are configured to identify the bank specific part of this processing. As illustrated, the memory power controller 401 includes a plurality of i controller back end blocks 410-1, 410-2, ... 410-i and a plurality of pipeline delay blocks 420, where each controller back end block 410 is connected to receive n "VALID" memory cut select signals 402-403 from the memory access specific controller front ends connected to each memory access observer. Thus, the logic in the controller back end block 410 and the pipeline delay element 420 will be replicated for every memory bank 1-n. Though not shown, the logic in the controller back end block 410 includes sorting logic for combining and sorting the "VALID" memory cut select signals 402-403 for all accesses into sorted memory cut select signals 404 for each memory cut. As a result of the sorting operation, any cut select signal for memory cut #1 is provided to a first OR stage 412, any cut select signal for memory cut #2 is provided to a second OR stage (not shown), and so on until any cut select signal for memory cut # n is provided to the n-th OR stage 414 for all j*n signals from the j memory access observer units.

At each OR gate 412, 414, the sorted memory cut select signals 404 are logically combined to provide an asserted output 405, 406 whenever at least one of its inputs indicates a valid access request to the corresponding memory cut. The output of these OR gates 412, 414 then provides the power control signals CUTCTRLn (there is a group of n signals for each memory bank) described hereinbelow with reference to FIG. 5.

As described hereinabove, it will be appreciated that FIGS. 3-4 depict an example embodiment for the generation of i sets of the power control signals CUTCTRLn from the memory accesses observed by the j access observers, where FIG. 3 identifies the memory access specific part of this processing, and FIG. 4 identifies the bank specific part of this processing. However, these figures describe one of the possible forms of distribution of this functionality in which the part related to the memory accesses is distributed over the bus masters, while the part related to the banks is distributed over the banks. In other embodiments, both parts may be implemented in a centralized memory power controller. Also this scheme is extremely simple and permits a combinatorial implementation that immediately delivers a corresponding signal in every cycle.

At the memory power controller 110, the observed set of memory cut-specific access signals from the access observers 115-117 may be logically combined to generate a combined bank-specific cut selection signal for use in generating the power control signals 114 from the memory access requests prior to them entering the network. By providing the power control signals 114 directly to the system memory cuts power control while bypassing the path delays of the interconnect 118, the addressed memory cuts can be powered up to exit the low power mode at or before the time which the actual request reaches the RAM, thereby reducing or avoiding power-up latency. As will be appreciated, the memory power controller(s) 110 may generate power control signals 114 for each accessed memory block to have a delay or access time that is controlled based on an interconnect delay to an accessed memory block. In other embodiments, the power control signals 114 may be generated for each accessed memory block to have a deliver timing based on an interconnect path delay, memory block access delay, and a memory bank controller delay for said accessed memory block. In other embodiments, the memory power controller 110 may be configured to control a power state for only a single memory bank, for only a single memory block within a memory bank, or for a plurality of associated memory blocks in the plurality of memory banks. In yet other embodiments, the power control signals 114 provided to each memory block may define a plurality of power modes.

To generate the power control signals 114, the memory power controller 110 may include a memory cut selector 112 which logically combines (e.g., OR's) the bank-specific cut selection signals from all bus monitors 115-117 to generate a combined bank-specific cut selection signal (e.g., CUTCTRL=CUTONEBANK[ACC_OBS1] OR CUTONEBANK[ACC_OBS 2] OR . . . OR CUTONEBANK[ACC_OBS j]), thereby providing, for each memory bank, a combined indication of memory accesses detected by the bus monitors 115-117, as described in FIG. 4. By avoiding this stage or by combining the cut select signals, the above variances can be easily achieved. The generated CUTCTRLn signals are then provided to the power control request elements 421-422

The generation of the power control signals 114 by the bank or memory cut power control logic may also include an internal delay pipeline 113 that is configured to include a number of stages that corresponds to the known delay 111 of the interconnect (and potentially other involved delays, such as the delay caused by the bank controller processing, etc.). Usage of this delay permits the adaption of the power-down requests to SoC specific behavior and delays, but also forms an observation window that can be used to inhibit excessive toggling of the power state. To provide additional details for an improved understanding of selected embodiments of the internal delay pipeline 113, reference is now made to FIG. 5 which is a simplified block diagram depiction of a pipelined delay circuit 500 for generating a power control request for a memory access cut which may control or forms part of the power control unit(s) 119 depicted in FIG. 1 along with additional logic (not shown) which may be used to control the specific power signals of a memory cut that are not of interest for this disclosure. The depicted pipelined delay circuit 500 may include a specific number of pipelined storage elements 503-511. In an example embodiment, the pipelined storage elements 503-511 may be implemented by flip-flops forming a serial shift register having at least the amount of storage elements as the minimum intrinsic delay in the highest supported system clock frequency for all involved processing steps noted above. The power control signal CUTCTRLn related to this memory cut (or bank in case there is only a control per bank being implemented) provided by the controller back end enters this shift register as signal CUTCTRL, and is then shifted one storage element further in every clock cycle.

In embodiments where one-hot encoding is used to signal the selection of this particular memory cut or bank, a logical "one" in any of these pipeline stages denotes that the memory cut is required to be in active mode at a certain time (which may be accessed in the future since the signal arrives before the actual request arrives at the memory cut). In addition, earlier accesses may be reflected within additional, further stages added. In cases where a different clock frequency results in a different intrinsic delay of the interconnect, only a masked subset of these storage elements may be used as described below to determine the power control request.

Figure 5:
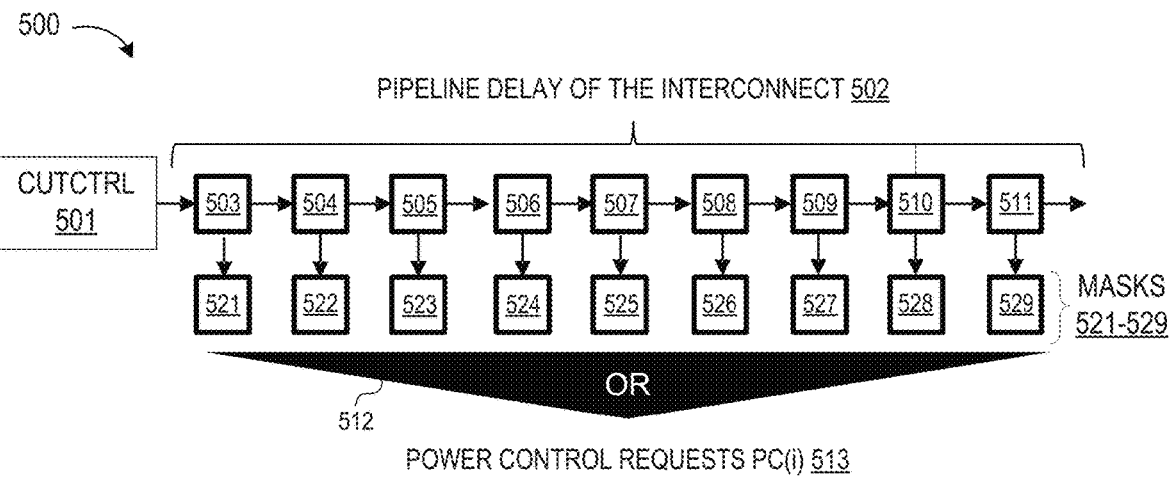
FIG. 5 depicts a simplified block diagram of a pipelined delay circuit for generating power control-requests for an accessed memory block or cut in accordance with selected embodiments of the present disclosure.

For any accessed memory cut, the elements shown in FIG. 5 may generate a single power control signal 513, which corresponds to one of the signals PC(n) shown in FIG. 1 for a particular memory cut or bank. As such, any such element implements one of the power control request elements 421-422 shown in FIG. 4, and relates to the combination of the delay pipeline 113 and power control unit 119 functionality shown in FIG. 1. It performs this function by logically combining the content of all selected stages in the pipeline 500. For this purpose, the set of pipelined storage elements 503-511 (or a subset of them) may be selected by applying a programmable mask 521-529. Such a mask 521-529 permits relevant control bits to be adjusted in accordance with a modified SoC behavior (e.g., changes in the system clock). The output of the selected (and masked) set of storage elements 503-511 is combined by a single OR gate 512 having as many inputs as the amount of (masked) pipelined storage elements 503-511, with elements not of interest have been excluded by the mask 521-529. In this way, any power control unit 119 will generate power control requests 513 only for memory access cuts that are used in any of the pipeline stages, thereby avoiding power-up of memory cuts that will not be used in the foreseeable future to prevent power toggling. Any generated power control request 513 is then delivered as power control signal PC(n) to control the power state of a particular memory cut, as is shown in FIG. 1.

Figure 6:
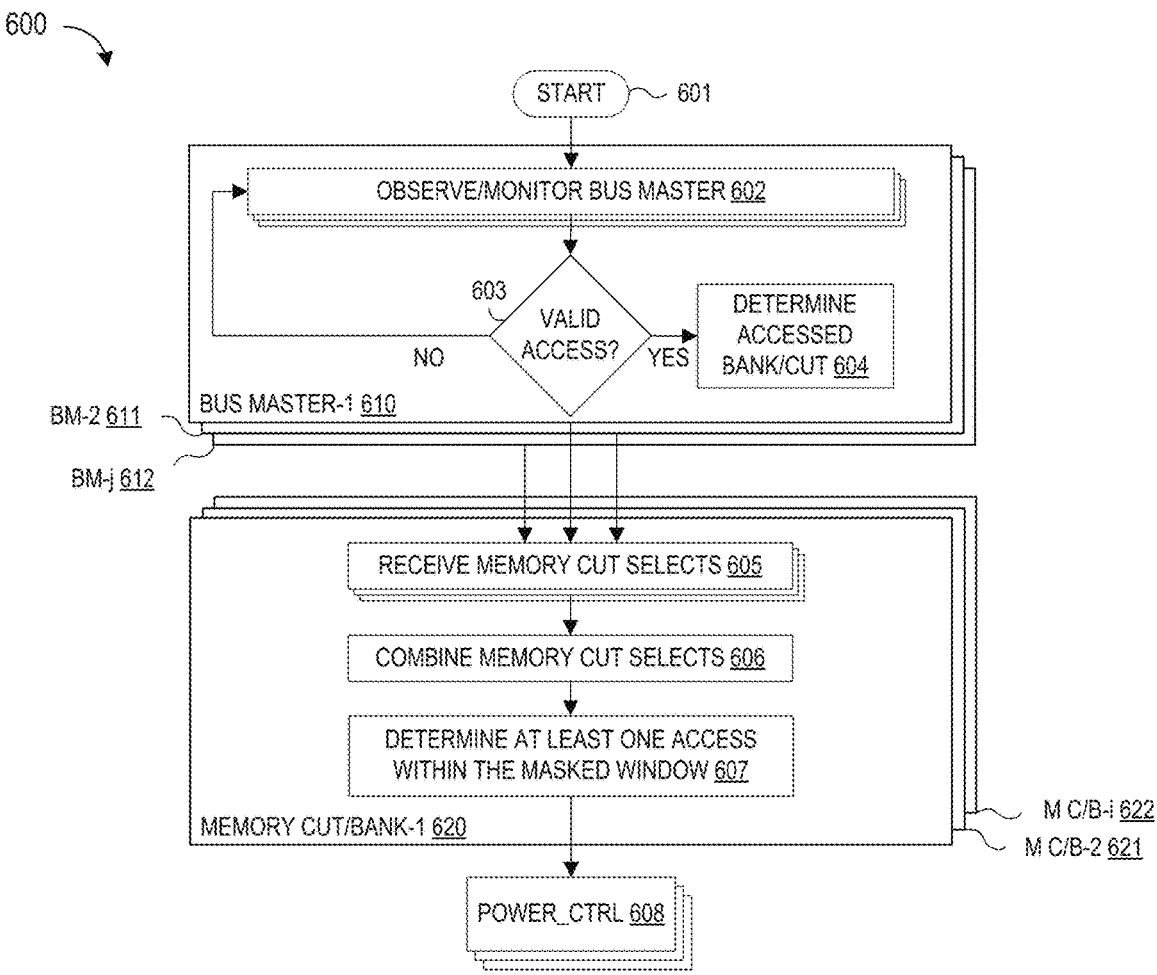
FIG. 6 illustrates a simplified flow chart sequence for a memory power management sequence for employing a low power mode with low latency and high granularity in accordance with selected embodiments of the present disclosure.

To provide additional details for an improved understanding of selected embodiments of the present disclosure, reference is now made to FIG. 6 which depicts a simplified flow chart sequence 600 for a memory cut power management sequence for employing a low power mode with low latency and high granularity in accordance with selected embodiments of the present disclosure. In the depicted example embodiments, the control logic and methodology shown in FIG. 6 may be implemented in a system-on-chip (SoC) device, such as an automotive microcontroller, with a combination of hardware and software which collects bus master memory access information at distributed bus monitors and processes the collected information tinder software control to generate access cut specific (static) power control signals to provide maximum control of power consumption requirements that can be adapted to the running software as needed. Thus implemented, the specified sequence of operations may be performed at the memory power controller to improve the performance of a low-power mode" by implementing dynamic power consumption reduction that is controlled by the bus master hardware monitors (e.g., access observers) to issue bank and cut specific power-up signals that effectively detect the "foreseeable future" of memory access operations at the granularity of a memory cut.

In FIG. 6, the method starts at step 601 when the SoC device is booted up or turned "on" to begin normal operations. Once operative, each bus master performs an initial sequence of steps 610-613 corresponding to each bus master j. For example, a first bus master (BM-1) is observed or monitored at step 602 for memory access requests, such as system memory write or read requests, that are issued to the interconnect fabric for memory accesses to the system memory. The monitoring process at step 602 may be performed by an access observer unit positioned at the bus master. If no valid access request has been made by a bus master (negative outcome to detection step 603), then the bus masters continue to be observed or monitored. However, if the bus master issues a valid access request in a given cycle (affirmative outcome to detection step 603), then the method proceeds to step 604 where the accessed memory bank and cut are identified or determined. The identification process at step 604 may be performed by the memory access observer and/or an associated memory power controller. As indicated with the plurality of boxes 610, 611, 612, the processing steps 602-604 may be performed at each cycle for each bus master.

For each memory cut and bank, the corresponding memory cut select signals generated from the plurality of bus masters 610-612 are processed to generate power control signals 608 for each memory bank and cut 620-622. For example, at step 605, the memory power controller receives memory cut select signals at each cycle from every memory access observer that is monitoring a corresponding bus master. Generally speaking, the memory power controller may receive the memory cut select signals be notified at step 605 when is each memory access observer provides access usage information to the memory power controller for each memory cut in each memory bank that is detected in connection with a valid memory access. In selected embodiments, the access usage information may include a valid access indication along with required memory address information for the memory bank ("BANK") and memory cut ("CUTSEL") being accessed. In other embodiments, the access usage information may include a valid access indication along with encoded memory bank address and encoded memory cut address information. For example, both the memory bank and memory cut address bits can be one-hot encoded (or one-cold encoded) upon detecting a valid access by the access observer, thereby generating a one-hot encoded bank select address ("BANK.SEL1") and one-hot encoded cut select address ("CUT1"). In this way, each access observer can be configured to provide to every bank a set of cut-specific selection signals for every cycle: CUTONEBANK=VALID & BANKSEL1[BANK] & CUT1. Alternatively, the memory power controller can receive the memory address information for the memory bank ("BANK") and memory cut ("CUTSEL") from each access observer and provide required encoding at the memory power controller.

At step 606, the memory cut select signals are combined at each cycle. In an example embodiment, the memory power controller may logically combine, for each bank, the one-hot encoded cut-specific selection signals from each access observer using a logical "OR" combination to generate a combined selection signal for each memory cut in that bank, CUTCTRL=CUTONEBANK[OBS1] OR CUTONEBANK[OBS2] OR . . . CUTONEBANK[OBSj].

To address power consumption issues that arise when a quick series of retention mode "power-up" and "power-down" signals are applied for repeatedly entering and leaving the retention mode, each memory bank and cut determines if there is at least one memory access within a masked window at step 607. To this end, the combined selection signal for each memory cut in a bank (CUTCTRL) may be supplied to a delay pipeline circuit to avoid power-up/down toggling of memory cuts that will be accessed in a time window spanned by the delay of the pipeline circuit. For example, the combined selection signal for each memory cut in a bank (CUTCTRL) that is generated each cycle may be shifted into an internal delay pipeline circuit which holds a number of delay stages that is greater than or equal to the interconnect delay (and potentially other involved delay elements, such as the bank controller, processing delay, etc.). By shifting the signals into the delay pipeline at each cycle, the memory power controller can "look ahead" to see if a memory access cut is being accessed (or not) in the near future. In an example embodiment where the combined selection signal for each memory cut is one-hot encoded, each stage in the delay pipeline circuit will indicate a memory cut access with a stored "1" value and will indicate no access with a stored "0" value. With this encoding scheme, the content of all the pipeline stages for any cut can be logically combined (e.g., OR'd together) to generate a power-down signal for the cut when the OR output is "0" since this indicates that there will be no near-term access for this memory cut. However, if the OR combination of the values in the pipeline stages is a "1," then the power-up signal for the memory cut is maintained or issued to keep the memory cut powered up (or remove it from the low power mode), thereby providing the retention mode power saving benefits without wasteful toggling. As indicated with the plurality of boxes 620-622, the processing steps 605-607 may be performed at each cycle for each memory bank and cut.

At step 608, the memory power controller selectively removes accessed memory cuts in each bank from a "low power mode" by issuing power control signal(s) PC(n) to each accessed memory cut based on the access usage information and inherent system-on-chip latencies while maintaining remaining memory cuts in low power mode. In generating the power control signals, the memory power controller may generate bank-specific cut selection signals to reflect the memory access requests observed from all of the bus masters, and then issue a corresponding power-up signal to each accessed memory cut in each memory bank. Knowing the required interconnect path delay for a memory cut access request to arrive at an addressed memory location, the timing for generating the power-up signal can be controlled to arrive at the addressed memory so that it exits a low power mode at or before the actual memory cut access request reaches the memory. As a result, the system memory will be able to process the request instantly or at least earlier as compared to being instructed to leave the low power mode when the request arrives at the memory.

At step 606, the power control sequence 602-606 ends for a given memory access cycle, at which point the methodology may restart for the next memory access cycle. As can be seen from the foregoing, the disclosed implementation and methodology provide a number of benefits and improvements to the operation of a computing device by providing memory cut-specific power control signals under software control so that power consumption needs can be adapted under software control to dynamically implement the "low power mode" feature at the memory cut level. Implemented with hardware observer units which detect memory access requests at the earliest point possible, the power control signals issued to the addressed memory can exploit inherent latencies within a system-on-a-chip by being issued "early" to the addressed memory to reduce the resulting latency for wakeup and/or to avoid power-down of memory cuts that will be used in a programmable timer period. In example multi-bank system memory embodiments employing a memory interleaving scheme wherein only one access cut of a memory bank can be active at any one time (or else all memory cuts are inactive), significant power savings can be achieved. For example, in a memory system employing 16 memory banks, each having 16 memory cuts, then the power control sequence can be applied to turn "off" the 15 memory cuts that are not accessed in a bank that is being accessed, resulting in a potential of ~93% of the power difference between the active power mode and low power mode, where 100% can be reached when a bank is not accessed at all. In the case of the memories used in the selected memory design and process embodiments, this difference is about 30% of the leakage power (all cuts in low power), resulting in a potential power savings of ~28%. Of course, memory banks that are not accessed are automatically kept in a reduced power mode by the disclosed memory access scheme, further increasing the potential savings.

By now it should be appreciated that there has been provided an apparatus, method, program code, and system for adaptive power saving control for an integrated circuit device, such as an automotive system-on-chip (SoC) device. In the disclosed embodiments, the disclosed system includes one or more bus master devices that are connected over respective bus master signal busses to an interconnect for making memory access requests to a system memory. The bus masters may be embodied as a processor core, a direct memory access controller, a central processing unit, a coprocessor, and/or a peripheral bus master. As disclosed, the system memory may include one or more memory arrays, each including a plurality of memory banks connected to the interconnect for providing independent, concurrent memory access to at least one memory block in each memory bank in response to memory access requests. In selected embodiments, a memory array may include a plurality of RAM blocks (or memory cuts) organized as a plurality of i independently accessible memory banks which are each formed with n memory blocks, where n≥1, to form an n×i array of memory blocks. The disclosed system also includes a memory access observer circuit connected to each bus master interface for providing a notification that a valid memory access request was issued by a bus master device over the bus master interface signals. Embodied as a bus monitor circuit, each memory access observer circuit may generate, for each valid memory access request, encoded memory block address information for a selected memory bank and memory block being accessed by the valid memory access request issued by the bus master device over the bus master interface signals. In addition, the disclosed system includes power control circuitry coupled to process notifications received from each memory access observer circuit and to generate therefrom power control signals that are provided directly to each memory block and to bypass the interconnect, thereby separately controlling a power state for each memory block with power-up control signals that arrive at each memory block at or before the associated memory access request is received over the interconnect. In selected embodiments, the power control circuitry is embodied as a single memory power controller unit connected to receive notifications from each memory access observer circuit and to separately provide a power control signal to each memory block in each memory bank. In other embodiments, the power control circuitry is embodied as a plurality of memory power controller units distributed across the integrated circuit, each associated with a memory bank and connected to receive notifications from each memory access observer circuit and to separately provide a power control signal to each memory block in its associated memory bank. In yet other embodiments, the power control circuitry generates each power control signal for an accessed memory block based on an internal, intrinsic delay to said accessed memory block and a delay pipeline recording of a history of memory accesses over an observation window equal to a size of the delay pipeline. In still yet other embodiments, the internal, intrinsic delay used by the power control circuitry to generate each power control signal for an accessed memory block is based on at least two delay measures selected from a group consisting of an interconnect path delay, memory block access delay, and a memory bank controller delay for said accessed memory block. In other embodiments, the power control circuitry is configured to separately control a power state for each memory block to provide an early power-up control signal and/or a late power-down control signal based on the history of memory accesses recorded by the delay pipeline. In other embodiments, the power control circuitry is configured to use an additional, software programmable mask to select the data respective time of interest within the history of access information recorded by the delay pipeline to create the separate controls for a power state to provide an early power control signal and/or a late power-down control signal for each memory block. In other embodiments, the power control circuitry is configured to separately control a power state for only a single memory bank, for only a single memory block within a memory bank, or for a plurality of associated memory blocks in the plurality of memory banks. In yet other embodiments, the power control signals provided to each memory block may define a plurality of power modes.

In another form, there is provided a power saving apparatus, method, program code, and system for an integrated circuit device, such as an automotive system-on-chip (SoC) device. In the disclosed embodiments, one or more bus master devices are monitored to detect valid memory block access requests sent over an interconnect to a memory array formed with a plurality of memory banks connected to the interconnect for providing independent, concurrent memory access to at least one memory block in each memory bank in response to memory block access requests. In selected embodiments, an access observer unit monitors each bus master device to generate, for each valid memory block access request, a valid access signal and encoded memory block address information for a selected memory bank and memory block being accessed by the valid memory block access request. Upon detecting a valid memory block access request from a bus master device, a notification is provided for each valid memory block access request issued by a bus master device over the interconnect to an accessed memory block. In selected embodiments, the notifications are provided to a controller front end in the form of a valid access qualifier signal, memory bank selection address, and memory block selection address for each valid memory block access request sent by a bus master device over the interconnect. At a memory power controller hardware circuit, the notifications are processed to provide separate power control signals to each memory block which bypass the interconnect and separately control a power state for each memory block such that the power control signals arrive at each accessed memory block at or before an associated memory access request is received over the interconnect. In selected embodiments, the notifications are processed by processing the valid access qualifier signal, memory bank selection address, and memory block selection address for each valid memory block access request to generate a valid memory block select signal for each bank; and sorting and combining the valid memory block select signals for all memory block accesses to generate a single valid memory block select signal for all memory block access requests to each memory bank. In generating the power control signals, the signal delivery timing is controlled based on an least two delay measures selected from a group consisting of an interconnect path delay, memory block access delay, a memory bank controller delay, and a software-programmable delay for said accessed memory and a delay pipeline recording a history of memory block accesses over an observation window equal to a size of the delay pipeline, where the size of the pipeline corresponds to said two delay measures. In addition, the single valid memory block select signal may be supplied, at each cycle, to a plurality of pipelined storage elements defining a specified time window to identify at least one memory block access within the specified time window. In such embodiments, a programmable mask may be applied to the plurality of pipelined storage elements so that the outputs from the masked plurality of pipelined storage elements may be logically combined to generate the power control signals for each memory block.

In yet another form, there is provided integrated circuit device, method, program code, and system for controlling power consumption. In the disclosed embodiments, the integrated circuit includes a multi-bank interleaved memory system having a plurality of RAM memory sub-arrays organized as a plurality of i independently accessible memory banks which are each formed with n memory sub-arrays, where n≥1, to form an n×i array of memory sub-arrays. In addition, the integrated circuit includes a plurality of bus master devices connected to the multi-bank interleaved memory system over a corresponding plurality of bus master interface busses. The integrated circuit also includes a plurality of access observer circuits connected, respectively, to the corresponding plurality of bus master interface busses to separately monitor the plurality of bus master devices for valid memory sub-array access requests sent over the interconnect and to generate, for each valid memory sub-array access request, a notification which may include a valid access signal and encoded memory sub-array address information for a selected memory bank and memory sub-array being accessed by the valid memory sub-array access request. Finally, the integrated circuit includes a memory power controller for notifications to provide separate power control signals to each memory sub-array which bypass the interconnect and separately control a power state for each memory sub-array such that the power control signals arrive at each accessed memory sub-array at or before an associated memory access request is received over the interconnect by controlling a power control signal delivery timing based on an least two delay measures selected from a group consisting of an interconnect path delay, memory sub-array access delay, a memory bank controller delay, and a software-programmable delay for said accessed memory. In selected embodiments, the memory power controller may be centrally located. In other embodiments, the memory power controller may be embodied in a distributed arrangement to include a plurality of front end hardware circuits, each located at an output of one of the plurality of bus master devices, and a plurality of back end hardware circuits, each located at a corresponding one of the plurality of i independently accessible memory banks.

Although the described exemplary embodiments disclosed herein are directed to power control methods and systems for multi-bank memories in which memory interleaving is used to allow concurrent memory bank access operations, the present invention is not necessarily limited to the example embodiments illustrated herein, and various embodiments of the circuitry and methods disclosed herein may be implemented with other devices and circuit components. For example, various embodiments may be implemented to reduce power consumption of multi-bank memories, improve the response times of accessing memory blocks in a low-power mode, preventing toggling of memory blocks between a power-down and power-up mode when the memory block will be used within a programmable time period, provide different strategies for power-up and power-down operations at each memory block, and otherwise reducing power consumption by using the delay depth of the interconnect to control the delivery timing of power control signals to reduce or eliminate the power-up latency for removing a memory cut from a low power mode (e.g., retention mode). Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Various illustrative embodiments of the present invention have been described in detail with reference to the accompanying figures. While various details are set forth in the foregoing description, it will be appreciated that the present invention may be practiced without these specific details, and that numerous implementation-specific decisions may be made to the invention described herein to achieve the circuit designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are shown in block diagram form, rather than in detail, in order to avoid limiting or obscuring the present invention. In addition, some portions of the detailed descriptions provided herein are presented in terms of algorithms or operations on data within a computer memory. Such descriptions and representations are used by those skilled in the art to describe and convey the substance of their work to others skilled in the art.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A power saving control system for an integrated circuit, comprising:
   one or more bus master devices connected over respective bus master interface busses to an interconnect;
   at least one memory array comprising a plurality of memory banks connected to the interconnect for providing independent, concurrent memory access to at least one memory block in each memory bank in response to memory access requests;
   a memory access observer circuit connected to each bus master interface bus for providing a notification that a valid memory access request was issued by a bus master device over the bus master interface bus; and
   power control circuitry coupled to process notifications received from each memory access observer circuit and to generate therefrom power control signals that are provided directly to each memory block and to bypass the interconnect, thereby separately controlling a power state for each memory block with power control signals that arrive at each memory block at or before an associated memory access request is received over the interconnect, wherein each power control signal for an accessed memory block is based on an internal, intrinsic delay to said accessed memory block and a delay pipeline recording of a history of memory accesses over an observation window equal to a size of the delay pipeline, and the internal, intrinsic delay is based on at least two delay measures selected from a group consisting of an interconnect path delay, memory block access delay, a memory bank controller delay for said accessed memory block.

2. The power saving control system of claim 1, where one or more bus master devices are selected from a group consisting of a processor core, a direct memory access controller, a central processing unit, a coprocessor, and a peripheral bus master.

3. The power saving control system of claim 1, wherein each memory access observer circuit generates, for each valid memory access request, encoded memory block address information for a selected memory bank and memory block being accessed by the valid memory access request issued by the bus master device over the bus master interface bus that is sent to the power control circuitry as part of the notification.

4. The power saving control system of claim 1, wherein the power control circuitry comprises a single power controller unit connected to receive notifications from each memory access observer circuit and to separately provide a power control signal to each memory block in each memory bank.

5. The power saving control system of claim 1, wherein the power control circuitry comprises a plurality of power controller units distributed across the integrated circuit, each associated with a memory bank and connected to receive notifications from each memory access observer circuit and to separately provide a power control signal to each memory block in its associated memory bank.

6. The power saving control system of claim 1, wherein the power control circuitry is configured to separately control a power state for each memory block to provide an early power-on control signal and/or a late power-down control signal based on the history of memory accesses recorded by the delay pipeline.

7. The power saving control system of claim 6, wherein the power control circuitry is configured to use an additional, software programmable mask to select the data respective time of interest within the history of access information recorded by the delay pipeline to create the separate controls for a power state to provide an early power control signal and/or a late power-down control signal for each memory block.

8. The power saving control system of claim 1, wherein the power control circuitry is configured to separately control a power state for only a single memory bank, for only a single memory block within a memory bank, or for a plurality of associated memory blocks in the plurality of memory banks.

9. The power saving control system of claim 1, wherein the power control signals provided to each memory block may define a plurality of power down modes.

10. A power saving method for an integrated circuit, comprising:
    monitoring one or more bus master devices to detect valid memory block access requests sent over an interconnect to a memory array comprising a plurality of memory banks connected to the interconnect for providing independent, concurrent memory access to at least one memory block in each memory bank in response to memory block access requests;
    providing a notification for each valid memory block access request issued by a bus master device over the interconnect to an accessed memory block; and
    processing notifications at a power controller hardware circuit to provide separate power control signals to each memory block which bypass the interconnect and separately control a power state for each memory block such that the power control signals arrive at each accessed memory block at or before an associated memory access request is received over the interconnect by controlling a power control signal delivery timing based on an least two delay measures selected from a group consisting of an interconnect path delay, memory block access delay, a memory bank controller delay, and a software-programmable delay for said accessed memory block and a delay pipeline recording a history of memory block accesses over an observation window equal to a size of the delay pipeline, where the size of the pipeline corresponds to said two delay measures.

11. The power saving method of claim 10, where an access observer unit monitors each bus master device to generate, for each valid memory block access request, a valid access signal and encoded memory block address information for a selected memory bank and memory block being accessed by the valid memory block access request.

12. The power saving method of claim 10, where one or more bus master devices are selected from a group consisting of a processor core, a direct memory access controller, a central processing unit, coprocessor, and a peripheral bus master.

13. The power saving method of claim 10, where providing notifications comprises providing a controller front end with a valid access qualifier signal, memory bank selection address, and memory block selection address for each valid memory block access request sent by a bus master device over the interconnect.

14. The power saving method of claim 13, where processing notifications comprises:
processing the valid access qualifier signal, memory bank selection address, and memory block selection address for each valid memory block access request to generate a valid memory block select signal for each bank; and
sorting and combining the valid memory block select signals for all memory block accesses to generate a single valid memory block select signal for all memory block access requests to each memory block.

15. The power saving method of claim 14, further comprising supplying, at each cycle, the single valid memory block select signal to a plurality of pipelined storage elements defining a specified time window to identify at least one memory block access within the specified time window.

16. The power saving method of claim 15, further comprising applying a programmable mask to the plurality of pipelined storage elements and logically combining outputs from the masked plurality of pipelined storage elements to generate the power control signals for each memory block.

17. An integrated circuit device comprising:
a multi-bank interleaved memory system comprising a plurality of RAM memory sub-array organized as a plurality of i independently accessible memory banks which are each formed with n memory sub-arrays, where n≥1, to form an n×i array of memory sub-arrays;
a plurality of bus master devices connected to the multi-bank interleaved memory system over a corresponding plurality of bus master interface busses;
a plurality of access observer circuits connected, respectively, to the corresponding plurality of bus master interface busses to separately monitor the plurality of bus master devices for valid memory sub-array access requests sent over the interconnect and to generate, for each valid memory sub-array access request, a notification comprising a valid access signal and encoded memory sub-array address information for a selected memory bank and memory sub-array being accessed by the valid memory sub-array access request;
a power controller for notifications to provide separate power control signals to each memory sub-array which bypass the interconnect and separately control a power state for each memory sub-array such that the power control signals arrive at each accessed memory sub-array at or before an associated memory access request is received over the interconnect, wherein each power control signal for an accessed memory sub-array is based on an internal, intrinsic delay to said accessed memory sub-array and a delay pipeline recording of a history of memory accesses over an observation window equal to a size of the delay pipeline, and the internal, intrinsic delay is based on at least two delay measures selected from a group consisting of an interconnect path delay, memory sub-array access delay, a memory bank controller delay for said accessed memory sub-array.

18. The integrated circuit device of claim 17, where the power controller comprises:
a plurality of front end hardware circuits, each located at an output of one of the plurality of bus master devices; and
a plurality of back end hardware circuits, each located at a corresponding one of the plurality of i independently accessible memory banks.

* * * * *